(12) United States Patent
Ichijo et al.

(10) Patent No.: US 8,552,425 B2
(45) Date of Patent: Oct. 8, 2013

(54) SEMICONDUCTOR DEVICE

(75) Inventors: Mitsuhiro Ichijo, Zama (JP); Toshiya Endo, Isehara (JP); Kunihiko Suzuki, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 124 days.

(21) Appl. No.: 13/157,637

(22) Filed: Jun. 10, 2011

(65) Prior Publication Data

US 2011/0309355 A1 Dec. 22, 2011

(30) Foreign Application Priority Data

Jun. 18, 2010 (JP) ................. 2010-139207

(51) Int. Cl.
*H01L 29/12* (2006.01)
(52) U.S. Cl.
USPC .................... 257/43; 257/E29.296
(58) Field of Classification Search
USPC .......................... 257/43, E29.296
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,191,463 B1 * | 2/2001 | Mitani et al. | 257/411 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Phuc Dang
(74) *Attorney, Agent, or Firm* — Eric J. Robinson; Robinson Intellectual Property Law Office, P.C.

(57) ABSTRACT

An object is to provide a semiconductor device having good electrical characteristics. A gate insulating layer having a hydrogen concentration less than $6 \times 10^{20}$ atoms/cm$^3$ and a fluorine concentration greater than or equal to $1 \times 10^{20}$ atoms/cm$^3$ is used as a gate insulating layer in contact with an oxide semiconductor layer forming a channel region, so that the amount of hydrogen released from the gate insulating layer can be reduced and diffusion of hydrogen into the oxide semiconductor layer can be prevented. Further, hydrogen present in the oxide semiconductor layer can be eliminated with the use of fluorine; thus, the hydrogen content in the oxide semiconductor layer can be reduced. Consequently, the semiconductor device having good electrical characteristics can be provided.

16 Claims, 10 Drawing Sheets

(56) References Cited

U.S. PATENT DOCUMENTS

| | | |
|---|---|---|
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,935,964 B2 | 5/2011 | Kim et al. |
| 7,998,372 B2 | 8/2011 | Yano et al. |
| 8,168,544 B2 | 5/2012 | Chang |
| 8,207,756 B2 | 6/2012 | Shionoiri et al. |
| 8,236,635 B2 | 8/2012 | Suzawa et al. |
| 8,242,494 B2 | 8/2012 | Suzawa et al. |
| 8,304,765 B2 | 11/2012 | Yamazaki et al. |
| 8,309,961 B2 | 11/2012 | Yamazaki et al. |
| 8,319,215 B2 | 11/2012 | Yamazaki et al. |
| 8,343,799 B2 | 1/2013 | Ito et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2004/0229476 A1* | 11/2004 | Kobayashi et al. ............ 438/775 |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1* | 4/2007 | Hayashi et al. ................ 257/72 |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1* | 10/2008 | Kim et al. ........................ 257/43 |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008638 A1 | 1/2009 | Kang et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0224239 A1 | 9/2009 | Wakita |
| 2009/0278122 A1 | 11/2009 | Hosono et al. |
| 2009/0280600 A1 | 11/2009 | Hosono et al. |
| 2010/0051949 A1 | 3/2010 | Yamazaki et al. |
| 2010/0065839 A1 | 3/2010 | Yamazaki et al. |
| 2010/0065840 A1 | 3/2010 | Yamazaki et al. |
| 2010/0065844 A1 | 3/2010 | Tokunaga |
| 2010/0072467 A1 | 3/2010 | Yamazaki et al. |
| 2010/0084650 A1 | 4/2010 | Yamazaki et al. |
| 2010/0084651 A1 | 4/2010 | Yamazaki et al. |
| 2010/0092800 A1 | 4/2010 | Itagaki et al. |
| 2010/0102312 A1 | 4/2010 | Yamazaki et al. |
| 2010/0105163 A1 | 4/2010 | Ito et al. |
| 2010/0109002 A1 | 5/2010 | Itagaki et al. |
| 2010/0117075 A1 | 5/2010 | Akimoto et al. |
| 2010/0123136 A1 | 5/2010 | Lee et al. |
| 2010/0181565 A1 | 7/2010 | Sakata et al. |
| 2010/0244022 A1* | 9/2010 | Takahashi et al. ............... 257/43 |
| 2010/0295041 A1 | 11/2010 | Kumomi et al. |
| 2010/0295042 A1 | 11/2010 | Yano et al. |
| 2010/0301329 A1 | 12/2010 | Asano et al. |
| 2011/0062433 A1 | 3/2011 | Yamazaki |
| 2011/0062436 A1 | 3/2011 | Yamazaki et al. |
| 2011/0117698 A1 | 5/2011 | Suzawa et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-074049 | 3/2006 |
| JP | 2006-165528 | 6/2006 |
| JP | 2007-096055 | 4/2007 |
| JP | 2007-123861 | 5/2007 |
| WO | WO 03/011196 | 2/2003 |
| WO | WO-2004/114391 | 12/2004 |
| WO | WO-2007/058231 | 5/2007 |
| WO | WO-2007/148601 | 12/2007 |
| WO | WO-2009/034953 | 3/2009 |
| WO | WO-2009/093625 | 7/2009 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors By Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$-$Ga_2ZnO_4$-ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$-$ZnGa_2O_4$-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films By Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)_m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$-$In_2O_3$-ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Paper, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MOO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In-Ga-Zn-Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the In2O3 and SC2O3-A2O3-BO Systems [A; Fe, Ga, or Al; B: Mg, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2005, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner (α−1)

(α−2)

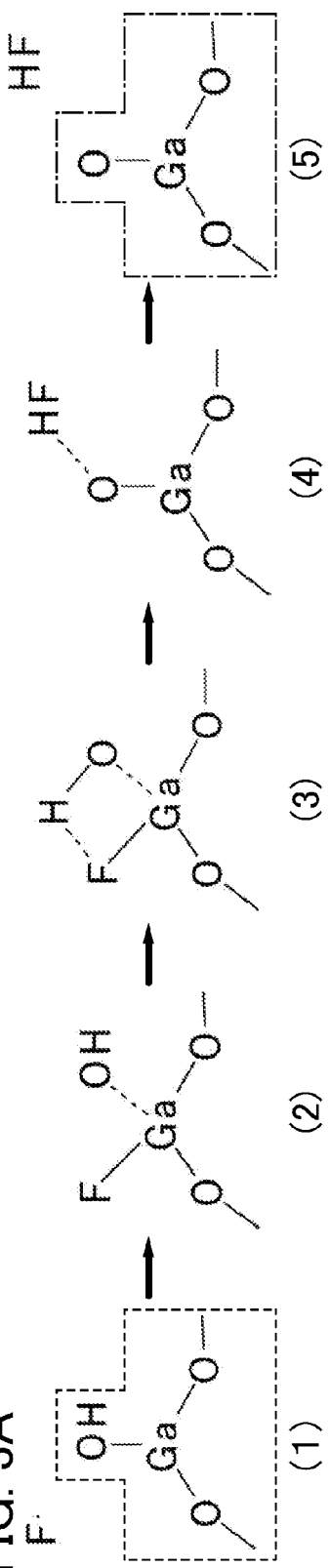
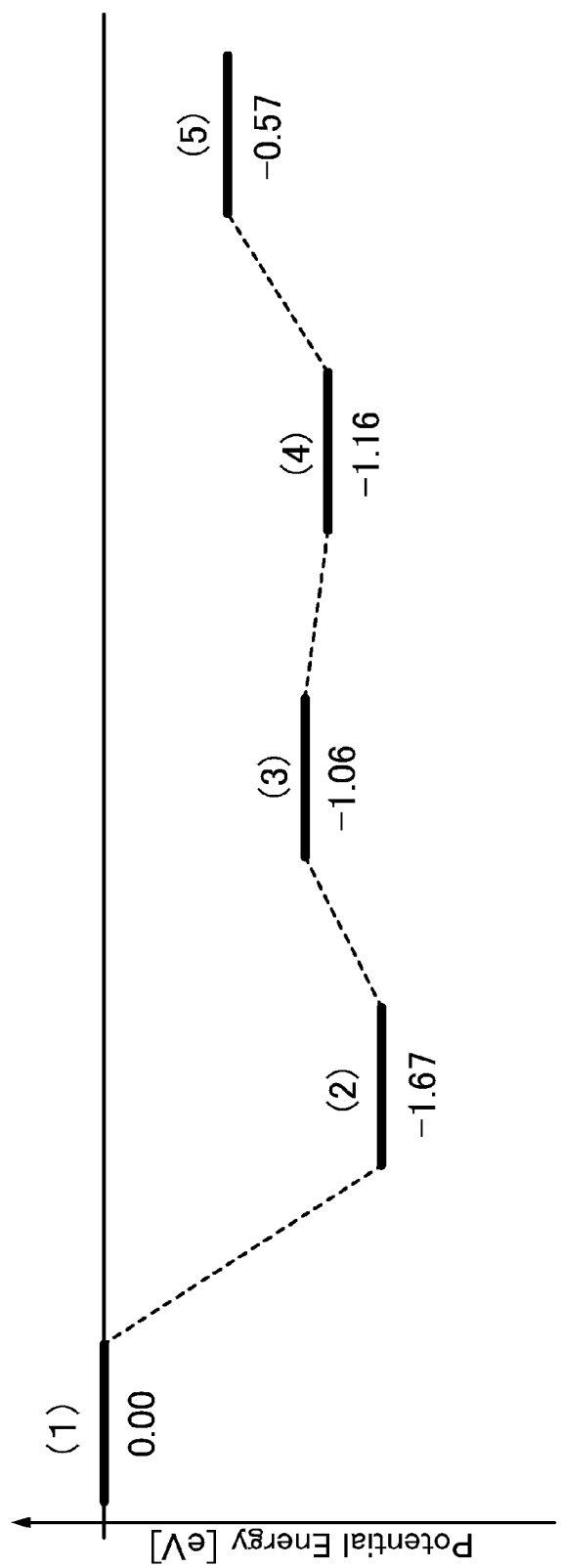
FIG. 3A
FIG. 3B

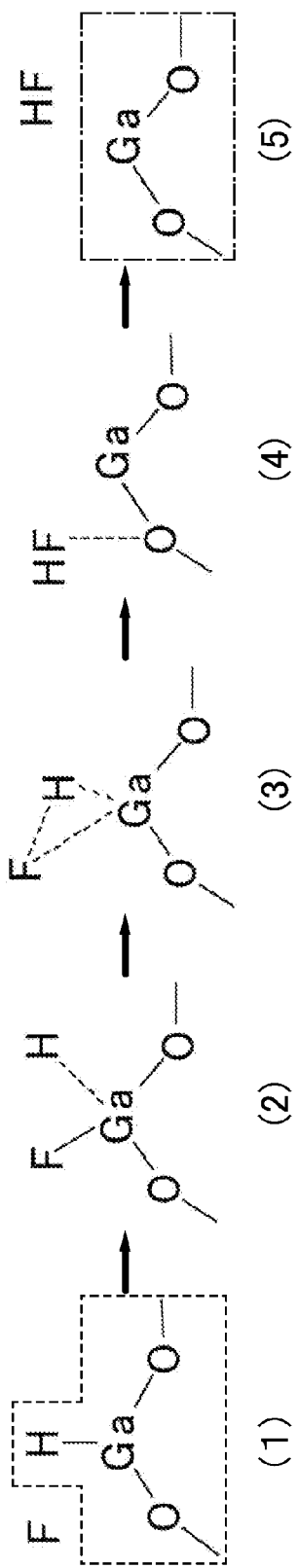
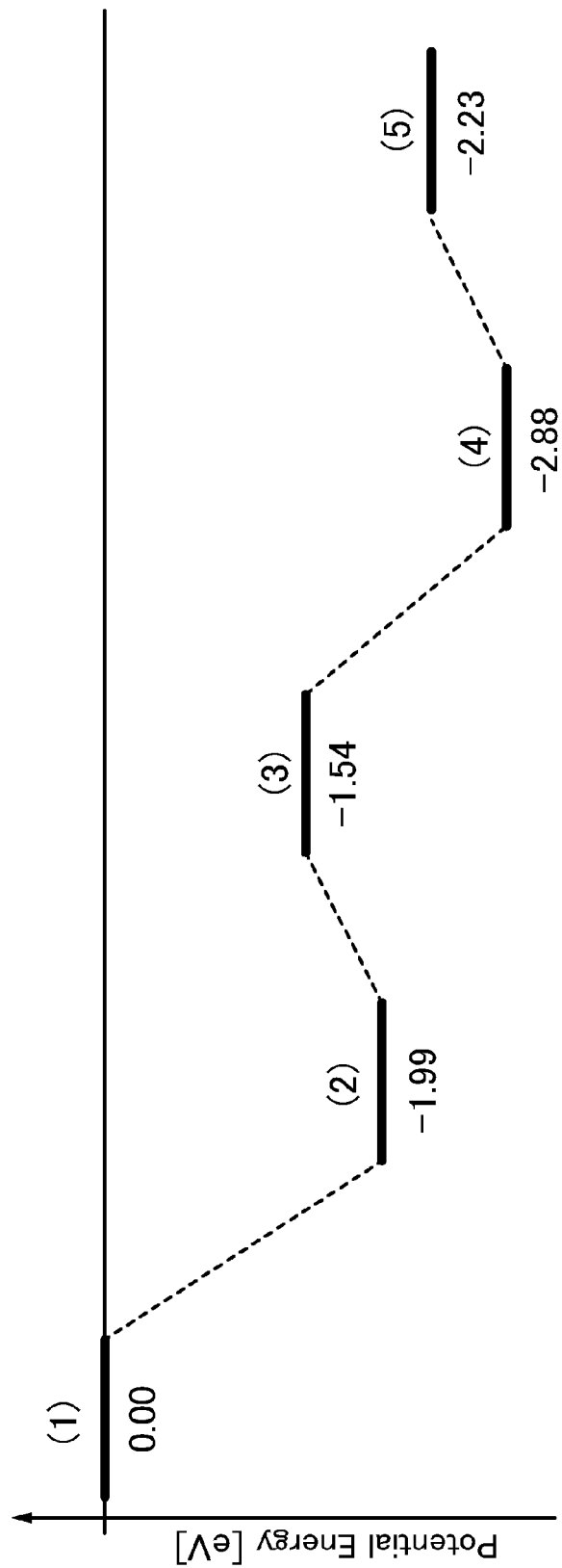
FIG. 5A
FIG. 5B

SEMICONDUCTOR DEVICE

BACKGROUND OF THE INVENTION

1. Field of the Invention

The present invention relates to a semiconductor device using an oxide semiconductor and a manufacturing method thereof.

In this specification, the term semiconductor device refers to all devices that can function by utilizing semiconductor characteristics, and electrooptic devices, semiconductor circuits, and electronic devices are all semiconductor devices.

2. Description of the Related Art

In recent years, transistors used for many liquid crystal display devices and light-emitting display devices typified by flat panel displays have been formed with silicon semiconductors, such as amorphous silicon or polycrystalline silicon, over a glass substrate.

Attention has been being directed to a technique in which, instead of such silicon semiconductors, oxide semiconductors are used for transistors.

Examples of the oxide semiconductors are zinc oxide, which is a metal oxide of one metal element, and In—Ga—Zn—O-based oxide, which is a homologous compound. Techniques are disclosed in which such oxide semiconductors are used to form transistors for switching elements or the like in pixels of display devices (see Patent Documents 1 to 3).

REFERENCES

Patent Documents

[Patent Document 1] Japanese Published Patent Application No. 2006-165528
[Patent Document 2] Japanese Published Patent Application No. 2007-96055
[Patent Document 3] Japanese Published Patent Application No. 2007-123861

SUMMARY OF THE INVENTION

A transistor using an oxide semiconductor for a channel region has a problem: with a shift of the threshold voltage ($V_{th}$) value in the negative direction, there occurs a flow of drain current (a normally-on state) even in the state where no voltage is applied to a gate electrode ($V_{gs}$=0 V).

In view of the above problem, an object of one embodiment of the present invention is to provide a semiconductor device having good electrical characteristics.

In order to solve the above problem, an insulating layer having a low hydrogen content and containing fluorine is used as a gate insulating layer in contact with an oxide semiconductor layer forming a channel region. By the use of the insulating layer as a gate insulating layer, the amount of hydrogen released from the gate insulating layer is reduced and hydrogen present in the oxide semiconductor layer can be eliminated; thus, the hydrogen content in the oxide semiconductor layer can be reduced.

Specifically, as the gate insulating layer, an insulating layer having a hydrogen concentration less than $6\times10^{20}$ atoms/cm$^3$, preferably less than or equal to $5\times10^{20}$ atoms/cm$^3$, and further preferably less than or equal to $5\times10^{19}$ atoms/cm$^3$, and a fluorine concentration greater than or equal to $1\times10^{20}$ atoms/cm$^3$ and preferably greater than or equal to $1\times10^{21}$ atoms/cm$^3$ is used.

Thus, one embodiment of the present invention is a semiconductor device including a gate electrode layer, an oxide semiconductor layer which forms a channel region, a source electrode layer and a drain electrode layer which are provided in contact with the oxide semiconductor layer, and a gate insulating layer provided between the gate electrode layer and the oxide semiconductor layer, in which the gate insulating layer has a hydrogen concentration less than $6\times10^{20}$ atoms/cm$^3$, preferably less than or equal to $5\times10^{20}$ atoms/cm$^3$, and further preferably less than or equal to $5\times10^{19}$ atoms/cm$^3$, and a fluorine concentration greater than or equal to $1\times10^{20}$ atoms/cm$^3$ and preferably greater than or equal to $1\times10^{21}$ atoms/cm$^3$.

The above semiconductor device is a semiconductor device having a bottom-gate structure in which the oxide semiconductor layer overlaps the gate electrode layer with the gate insulating layer interposed therebetween.

Further, in another embodiment of the present invention, the gate insulating layer is an oxide insulating layer including silicon oxide, silicon oxynitride, silicon nitride oxide, hafnium oxide, aluminum oxide, tantalum oxide, or the like.

In any of the above embodiments, the gate insulating layer is not limited to a single layer and may have a stacked structure. For example, the gate insulating layer may have two layers of a first gate insulating layer which covers the gate electrode layer and a second gate insulating layer which covers the first gate insulating layer and is in contact with the oxide semiconductor layer. In this case, since the second gate insulating layer is in contact with the oxide semiconductor layer, a gate insulating layer having a low hydrogen content and containing fluorine is used as the second gate insulating layer, so that the amount of hydrogen released from the second gate insulating layer is reduced and hydrogen present in the oxide semiconductor layer can be eliminated; thus, the hydrogen content in the oxide semiconductor layer can be reduced.

Therefore, according to another embodiment of the present invention, in any of the above semiconductor devices, the gate insulating layer includes a first gate insulating layer which covers the gate electrode layer, and a second gate insulating layer which covers the first gate insulating layer and is in contact with the oxide semiconductor layer, and the second gate insulating layer has a hydrogen concentration less than $6\times10^{20}$ atoms/cm$^3$, preferably less than or equal to $5\times10^{20}$ atoms/cm$^3$, and further preferably less than or equal to $5\times10^{19}$ atoms/cm$^3$, and a fluorine concentration greater than or equal to $1\times10^{20}$ atoms/cm$^3$ and preferably greater than or equal to $1\times10^{21}$ atoms/cm$^3$. Note that the first gate insulating layer preferably has a fluorine concentration less than $1\times10^{20}$ atoms/cm$^3$.

Any of the above semiconductor devices may include an insulating layer provided to face the gate insulating layer with the oxide semiconductor layer interposed therebetween and to be in contact with the oxide semiconductor layer. When the insulating layer has a low hydrogen content and contains fluorine like the gate insulating layer, the amount of hydrogen released from the insulating layer is reduced and hydrogen present in the oxide semiconductor layer can be eliminated; thus, the hydrogen content in the oxide semiconductor layer can be reduced.

According to another embodiment of the present invention, in any of the above semiconductor devices, the insulating layer in contact with the oxide semiconductor layer has a hydrogen concentration less than $6\times10^{20}$ atoms/cm$^3$, preferably less than or equal to $5\times10^{20}$ atoms/cm$^3$, and further preferably less than or equal to $5\times10^{19}$ atoms/cm$^3$, and a fluorine concentration greater than or equal to $1\times10^{20}$ atoms/cm$^3$ and preferably greater than or equal to $1\times10^{21}$ atoms/cm$^3$.

Further, like the gate insulating layer, the insulating layer provided over and in contact with the oxide semiconductor layer is preferably an oxide insulating layer including silicon oxide, silicon oxynitride, silicon nitride oxide, hafnium oxide, aluminum oxide, tantalum oxide, or the like.

According to one embodiment of the present invention, a semiconductor device having good electrical characteristics can be provided.

BRIEF DESCRIPTION OF THE DRAWINGS

FIGS. 3A and 3B illustrate reaction formulae of reaction for abstracting a hydrogen atom, and an energy diagram.

FIGS. 5A and 5B illustrate reaction formulae of reaction for abstracting a hydrogen atom, and an energy diagram.

DETAILED DESCRIPTION OF THE INVENTION

Figure 1A:
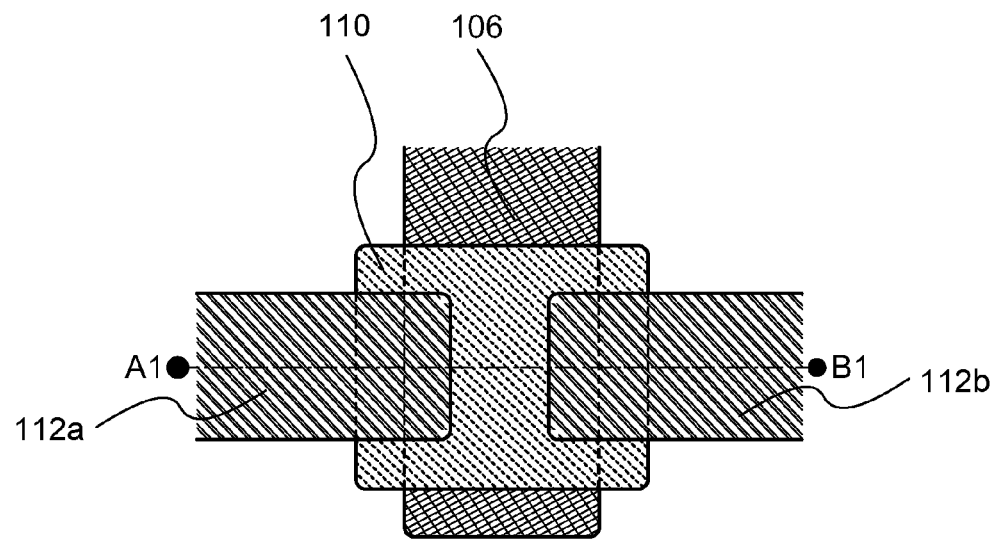
FIGS. 1A and 1B are a top view of a transistor and a cross-sectional view thereof.

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Therefore, the invention should not be construed as being limited to the description of the embodiments below. In describing structures of the present invention with reference to the drawings, components common between different drawings maintain the same reference numerals. The same hatching pattern is applied to similar parts, and the similar parts are not especially denoted by reference numerals in some cases. In addition, an insulating layer is not illustrated in a top view for convenience in some cases. Note that the size, the layer thickness, or the region of each structure illustrated in each drawing might be exaggerated for clarity. Therefore, the present invention is not necessarily limited to such scales.

Note that, functions of a "source" and a "drain" might be interchanged in the case where the direction of a current flow is changed in circuit operation, for example. Therefore, the terms "source" and "drain" can be replaced with each other in this specification.

Embodiment 1

In this embodiment, a semiconductor device which is one embodiment of the present invention is described with reference to FIGS. 1A and 1B. Note that a transistor is given as an example of the semiconductor device for description in this embodiment.

Figure 1B:
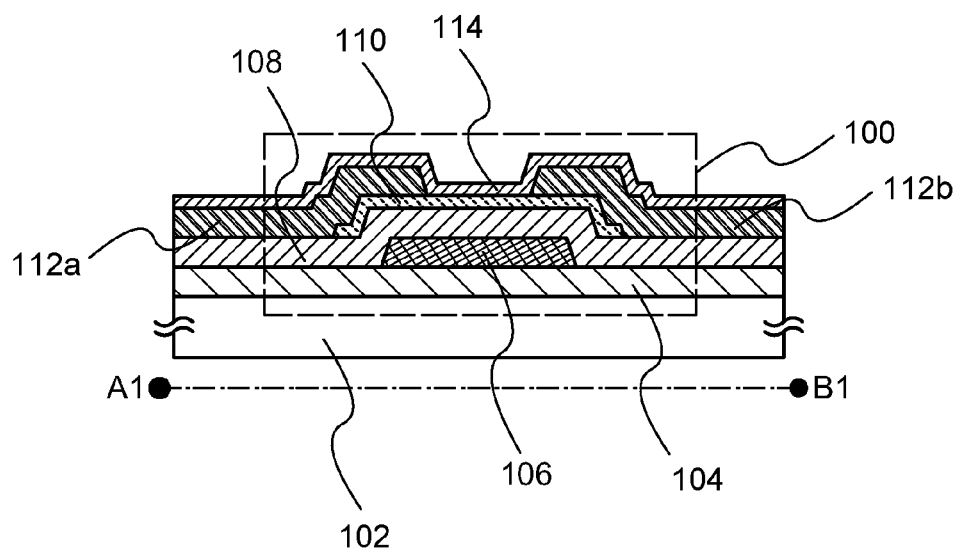

FIG. 1A is a top view of a transistor 100 included in a semiconductor device. FIG. 1B is a cross sectional view taken along an alternate long and short dashed line A1-B1 of FIG. 1A. The transistor 100 includes a base insulating layer 104, a gate electrode layer 106, a gate insulating layer 108, an oxide semiconductor layer 110 forming a channel region, a source electrode layer 112a, a drain electrode layer 112b, and an insulating layer 114 which covers the oxide semiconductor layer 110 forming a channel region, the source electrode layer 112a, and the drain electrode layer 112b, over a substrate 102.

The transistor 100 is a transistor having a bottom-gate structure, in which the oxide semiconductor layer 110 is provided to overlap the gate electrode layer 106 with the gate insulating layer 108 interposed therebetween. Further, the transistor 100 has a top-contact structure, in which the source electrode layer 112a and the drain electrode layer 112b are provided in contact with part of an upper surface of the oxide semiconductor layer 110. As a transistor having the bottom-gate structure, a transistor having a bottom-contact structure can be given in which a source electrode layer and a drain electrode layer are formed in contact with part of a lower surface of a semiconductor layer forming a channel region, other than a transistor having the top-contact structure. Although one embodiment of the present invention encompasses the top-contact structure and the bottom-contact structure, an example of the top-contact structure is given as an example for description in this embodiment.

In the transistor 100, part of the upper surface of the gate insulating layer 108 is in contact with the lower surface of the oxide semiconductor layer 110. Hence, in a process of fabricating the transistor 100, the hydrogen content in the oxide semiconductor layer 110 is increased by diffusion of hydrogen into the oxide semiconductor layer 110 if a large amount of hydrogen is present in the gate insulating layer 108. The increase in the hydrogen content in the oxide semiconductor layer 110 then causes an increase in carrier in the oxide semiconductor layer 110. Accordingly, the threshold voltage ($V_{th}$) value of the transistor 100 shifts in the negative direction, and there occurs a flow of drain current (a normally-on state) even in the state where no voltage is applied to a gate electrode ($V_{gs}$=0 V); thus, electrical characteristics of the transistor are degraded.

In view of the above, a method in which the oxide semiconductor layer 110 is subjected to heat treatment can be given as a method for removing the diffused hydrogen from the oxide semiconductor layer 110. However, such a method is not preferred since the increased number of steps for fabricating a transistor could lead to higher cost and a lower yield.

Therefore, the gate insulating layer 108 in contact with the oxide semiconductor layer 110 has a hydrogen concentration less than $6 \times 10^{20}$ atoms/cm$^3$, preferably less than or equal to $5 \times 10^{20}$ atoms/cm$^3$, and further preferably less than or equal to $5 \times 10^{19}$ atoms/cm$^3$, so that the amount of hydrogen released from the gate insulating layer 108 can be reduced, and the diffusion of hydrogen into the oxide semiconductor layer 110 can be suppressed accordingly. Furthermore, the gate insulating layer 108 in contact with the oxide semiconductor layer 110 has a fluorine concentration greater than or equal to $1 \times 10^{20}$ atoms/cm$^3$ and preferably greater than or equal to $1 \times 10^{21}$ atoms/cm$^3$, so that hydrogen present in the oxide semiconductor layer 110 can be eliminated accordingly; thus, the hydrogen content in the oxide semiconductor layer 110 can be reduced.

In other words, a gate insulating layer having the above hydrogen concentration and the above fluorine concentration is used as the gate insulating layer 108 in contact with the oxide semiconductor layer 110, so that a transistor having good electrical characteristics can be provided without increasing the number of steps for fabricating the transistor.

The insulating layer 114, which covers the oxide semiconductor layer 110, the source electrode layer 112a, and the drain electrode layer 112b, is in contact with part of the upper surface of the oxide semiconductor layer 110. Therefore, the insulating layer 114 may have a hydrogen concentration less than $6\times10^{20}$ atoms/cm$^3$, preferably less than or equal to $5\times10^{20}$ atoms/cm$^3$, and further preferably less than or equal to $5\times10^{19}$ atoms/cm$^3$, and a fluorine concentration greater than or equal to $1\times10^{20}$ atoms/cm$^3$ and preferably greater than or equal to $1\times10^{21}$ atoms/cm$^3$. When the insulating layer 114 has the above hydrogen concentration, the amount of hydrogen released from the insulating layer 114 is reduced, and the diffusion of hydrogen into the oxide semiconductor layer 110 can be suppressed accordingly. Furthermore, when the insulating layer 114 has the above fluorine concentration, hydrogen present in the oxide semiconductor layer 110 can be eliminated accordingly; thus, the hydrogen content in the oxide semiconductor layer 110 can be reduced.

There is no particular limitation on the substrate 102 as long as it is resistant to a later fabrication step. Examples of the substrate that can be used as the substrate 102 are an insulating substrate such as a glass substrate, a ceramic substrate, a quartz substrate, or a sapphire substrate; a semiconductor substrate formed with a semiconductor material such as silicon; a conductive substrate formed with a conductor such as metal or stainless steel; and the like. In addition, a plastic substrate may be used as appropriate.

In the case where heat treatment at high temperature is performed in the process of fabricating the transistor, a substrate having a strain point greater than or equal to 730° C. is preferred as a glass substrate. For example, a glass material such as aluminosilicate glass, aluminoborosilicate glass, or barium borosilicate glass is used. Because more practical heat-resistant glass can be obtained by containing a larger amount of barium oxide (BaO) than boric acid, a glass substrate containing a larger amount of barium oxide than boron acid is preferably used.

The base insulating layer 104 can not only prevent diffusion of an impurity element from the substrate 102, but also prevent etching of the substrate by an etching step in the process of fabricating the transistor. This is why the thickness of the base insulating layer 104 is preferably, but not limited to, 50 nm or more. As long as a transistor having a bottom-gate structure can be obtained, the base insulating layer 104 is not necessarily provided because the gate insulating layer 108, which is formed later, can also serve as the base insulating layer 104 described above.

The base insulating layer 104 is provided using a material applicable to the gate insulating layer 108 formed later, as a single layer or a stacked structure.

The gate electrode layer 106 is provided over the base insulating layer 104. For the gate electrode layer 106, a metal material such as molybdenum, titanium, chromium, tantalum, tungsten, neodymium, or scandium, or an alloy material that contains any of these metal materials as a main component, or a nitride of any of these metals is used to form a conductive film as a single layer or a stacked structure. Note that aluminum or copper can also be used as such a metal material if it can withstand the temperature of heat treatment performed in a later step. Aluminum or copper is preferably used in combination with a refractory metal material so as to avoid problems of heat resistance and corrosion. As the refractory metal material, molybdenum, titanium, chromium, tantalum, tungsten, neodymium, scandium, or the like can be used.

For the gate electrode layer 106 having a stacked structure, it is preferable to use any of the following structures, for example: a two-layer structure in which a molybdenum film is stacked over an aluminum film; a two-layer structure in which a molybdenum film is stacked over a copper film; a two-layer structure in which a titanium nitride film or a tantalum nitride film is stacked over a copper film; and a two-layer structure in which a titanium nitride film and a molybdenum film are stacked. Furthermore, for the gate electrode layer 106 having a stacked structure, it is preferable to use a three-layer structure in which a middle layer is an aluminum film, an alloy film of aluminum and silicon, an alloy film of aluminum and titanium, or an alloy film of aluminum and neodymium, and an upper and a lower layer are selected from a tungsten film, a tungsten nitride film, a titanium nitride film, and a titanium film.

Further, for the gate electrode layer 106, an oxide conductive film having a light-transmitting property such as indium oxide, an alloy of indium oxide and tin oxide, an alloy of indium oxide and zinc oxide, zinc oxide, aluminum zinc oxide, aluminum zinc oxynitride or gallium zinc oxide, or polycrystalline silicon can be used.

The thickness of the gate electrode layer 106 is not particularly limited and can be determined as appropriate in consideration of time for the fabrication process or of electrical resistance of the conductive film formed with a metal material, an alloy material, or other compounds. For example, the gate electrode layer 106 can be formed to thickness of 10 nm to 500 nm.

The gate insulating layer 108 is provided covering the gate electrode layer 106. Since the gate insulating layer 108 is in contact with the oxide semiconductor layer 110, the gate insulating layer 108 has a hydrogen concentration less than $6\times10^{20}$ atoms/cm$^3$, preferably less than or equal to $5\times10^{20}$ atoms/cm$^3$, and further preferably less than or equal to $5\times10^{19}$ atoms/cm$^3$, and a fluorine concentration greater than or equal to $1\times10^{20}$ atoms/cm$^3$ and preferably greater than or equal to $1\times10^{21}$ atoms/cm$^3$.

Furthermore, the gate insulating layer 108 is provided using a material such as silicon oxide, silicon oxynitride, silicon nitride, silicon nitride oxide, hafnium oxide, aluminum oxide, or tantalum oxide, as a single layer or a stacked structure. The thickness of the gate insulating layer 108 can be determined as appropriate in consideration of breakdown voltage or the process of fabricating the transistor. For example, the thickness of the gate insulating layer 108 is preferably greater than or equal to 1 nm and less than or equal to 300 nm, and more preferably greater than or equal to 5 nm and less than or equal to 50 nm.

In particular, the gate insulating layer 108 can be a silicon oxide layer provided by a plasma CVD (plasma enhanced chemical vapor deposition) method.

The plasma CVD method refers to a method in which a film is formed by supplying a deposition gas, which is a raw material, to a reaction chamber in a plasma CVD apparatus with use of plasma energy.

Examples of the plasma CVD apparatus are a capacitively coupled high-frequency plasma CVD apparatus with a high-frequency power source, an inductively coupled high-frequency plasma CVD apparatus, a microwave plasma CVD apparatus (an electron cyclotron resonant plasma CVD apparatus) which has magnetron that is a microwave generation source and generates plasma with the microwave, a helicon wave plasma CVD apparatus, and the like. For the plasma CVD method in this specification, a CVD apparatus in which glow discharge plasma is utilized for film formation can be used as appropriate. Further, the plasma CVD method can be performed while the substrate is heated.

The deposition gas which is a raw material is formed with a gas whose molecular structure contains no hydrogen.

In other words, not $SiH_4$ but $SiF_4$ is used as the deposition gas. Further, $N_2O$ or $O_2$ with a low content of hydrogen and water is used as a gas for oxidation. Also as the other additional gas such as argon, a gas with a low content of hydrogen and water is used for spread of plasma.

In the formation of the silicon oxide layer by a plasma CVD method, after impurities such as hydrogen and water which remain in the reaction chamber of the plasma CVD apparatus or which are adsorbed to the inner wall of the reaction chamber are removed, the layer is formed using the above gases while the inner wall of the reaction chamber is heated. Thus, the silicon oxide layer can be formed by a plasma CVD method so as to have a hydrogen concentration less than $6 \times 10^{20}$ atoms/cm$^3$, preferably less than or equal to $5 \times 10^{20}$ atoms/cm$^3$, and further preferably less than or equal to $5 \times 10^{19}$ atoms/cm$^3$, and a fluorine concentration greater than or equal to $1 \times 10^{20}$ atoms/cm$^3$ and preferably greater than or equal to $1 \times 10^{21}$ atoms/cm$^3$.

Further, in the case where the gate insulating layer 108 has a two-layer structure, it is possible to prevent etching of the gate electrode layer 106, which might occur because of fluorine generated in the formation of the silicon oxide layer containing fluorine over the gate electrode layer 106. In that case, a first gate insulating layer in contact with the gate electrode layer 106 is an insulating layer having a low fluorine content, for example, a fluorine concentration less than $1 \times 10^{20}$ atoms/cm$^3$. In addition, a second gate insulating layer in contact with the oxide semiconductor layer 110 is an insulating layer having a fluorine concentration greater than or equal to $1 \times 10^{20}$ atoms/cm$^3$ and preferably greater than or equal to $1 \times 10^{21}$ atoms/cm$^3$, such as a silicon oxide layer using a $SiF_4$ gas. While there is no particular limitation on the hydrogen concentration in the first gate insulating layer, the hydrogen concentration in the second gate insulating layer is preferably as low as possible in consideration of the contact with the oxide semiconductor layer 110. For example, the hydrogen concentration in the second gate insulating layer is preferably less than $6 \times 10^{20}$ atoms/cm$^3$, preferably less than or equal to $5 \times 10^{20}$ atoms/cm$^3$, and further preferably less than or equal to $5 \times 10^{19}$ atoms/cm$^3$. Such hydrogen concentration enables suppression of hydrogen diffusion into the oxide semiconductor layer 110. Furthermore, the first gate insulating layer is formed to a thickness so as not to be removed in the formation of the second gate insulating layer (e.g., the silicon oxide layer using a $SiF_4$ gas as above). Note that as the first gate insulating layer, an oxide insulating layer given as an example for the gate insulating layer 108 can be used.

The oxide semiconductor layer 110 forming a channel region is provided over the gate insulating layer 108. The thickness of the oxide semiconductor layer 110 is 10 nm to 300 nm, preferably 20 nm to 100 nm.

The oxide semiconductor layer 110 is formed with an non-single-crystal film using an In—Ga—Zn—O-based metal oxide which contains In, Ga, and Zn as a material and has a structure represented as $InMO_3(ZnO)_m$ (m>0). Note that M denotes one or more of metal elements selected from gallium (Ga), iron (Fe), nickel (Ni), manganese (Mn), and cobalt (Co). For example, M is gallium (Ga) in some cases, and in other cases, M contains other metal elements in addition to Ga, such as Ga and Ni or Ga and Fe. Further, in the above metal oxide, Fe, Ni, or any other transition metal element, or an oxide of such transition metal may be contained as an impurity element in addition to the metal element contained as M. Further, when the metal oxide provided for the oxide semiconductor layer 110 is formed by a sputtering method, a metal oxide target that contains a metal oxide having a high relative density, e.g., greater than or equal to 80%, preferably greater than or equal to 95%, and more preferably greater than or equal to 99.9%, is used.

Specifically, any of the following metal oxides can be used for the formation: oxides of four metal elements such as an In—Sn—Ga—Zn—O-based metal oxide; oxides of three metal elements such as an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, and a Sn—Al—Zn—O-based metal oxide; oxides of two metal elements such as an In—Zn—O-based metal oxide, a Sn—Zn—O-based metal oxide, an Al—Zn—O-based metal oxide, a Zn—Mg—O-based metal oxide, a Sn—Mg—O-based metal oxide, and an In—Mg—O-based metal oxide; and oxides of one metal element such as an In—O-based metal oxide, a Sn—O-based metal oxide, a Zn—O-based metal oxide, and the like. Here, for example, the In—Ga—Zn—O-based metal oxide refers to an oxide containing at least In, Ga, and Zn, and there is no particular limitation on the composition ratio of the elements. In addition, an element other than In, Ga, and Zn may be contained. Moreover, silicon oxide may be contained in the oxide semiconductor layer 110.

The source electrode layer 112a and the drain electrode layer 112b are provided over the gate insulating layer 108 and the oxide semiconductor layer 110. Note that the source electrode layer 112a and the drain electrode layer 112b can be formed by any of the materials given as examples for the gate electrode layer 106. The thickness of the source electrode layer 112a and the drain electrode layer 112b can be selected as appropriate on the basis of the description for the gate electrode layer 106.

The insulating layer 114 functioning as a passivation film or an interlayer insulating film is provided covering the source electrode layer 112a, the drain electrode layer 112b, and the oxide semiconductor layer 110.

The insulating layer 114 can be formed by a plasma CVD method like the gate insulating layer 108. Since the insulating layer 114 is in contact with part of the upper surface of the oxide semiconductor layer 110, use of a silicon oxide layer like the gate insulating layer 108 enables a reduction in the amount of hydrogen released from the insulating layer 114 and elimination of hydrogen present in the oxide semiconductor layer 110; thus, the hydrogen content in the oxide semiconductor layer 110 can be reduced.

As in the case of the gate insulating layer 108, the thickness of the insulating layer 114 can be determined as appropriate in consideration of the possibility that the source electrode layer 112a and the drain electrode layer 112b might be etched because of fluorine generated in the formation of the silicon oxide layer containing fluorine.

As the insulating layer 114, an insulating layer in which only the hydrogen content is reduced may be used: for example, a silicon oxide layer is formed by a sputtering method performed as follows. Specifically, a Si target, a $SiO_2$ target, or the like is used, which is preferably a $SiO_2$ target, and more preferably a $SiO_2$ target whose hydroxyl concentration is less than or equal to 1000 ppm or whose hydrogen concentration measured by SIMS (secondary ion mass spectrometry) is less than or equal to $3.5 \times 10^{19}$ atoms/cm$^3$. A gas supplied for the formation is a rare gas such as argon and oxygen. In addition, as the gas supplied for the formation, it is preferable to use a high-purity gas from which impurities such as hydrogen, water, hydroxyl, or hydride are removed to the degree that the impurity concentration is expressed in ppm or ppb.

Here, quantum chemistry calculation is used to explain an effect obtained by the elimination of hydrogen present in the oxide semiconductor layer 110 owing to the use of an insulating layer containing fluorine as the gate insulating layer 108 in contact with the oxide semiconductor layer 110 and the insulating layer 114.

For the quantum chemistry calculation described in this embodiment, a density functional theory (DFT) method with a Gaussian base is used. In the density functional theory method, an exchange-correlation interaction is approximated by a functional of one electron potential represented in terms of electron density; thus, the calculations can be performed with high speed and high accuracy. In this embodiment, B3LYP which is a hybrid functional is used to specify the weight of each parameter related to exchange-correlation energy.

In addition, a basis function applied to all atoms is 6-311G, which is a basis function of a triple-split valence basis set using three contraction functions for each valence orbital. By this basis functions, orbits of 1s to 3s are considered for hydrogen atoms while orbits of 1s to 4s and 2p to 4p are considered for oxygen atoms. Furthermore, to improve calculation accuracy, the p function and the d function as polarization basis sets are used respectively for hydrogen atoms and atoms other than hydrogen atoms. In addition, Gaussian 09, which is produced by CONFLEX Corporation, is used as a program for the quantum chemistry calculation.

In this embodiment, a hydrogen atom present in the oxide semiconductor layer 110 is bonded to an oxygen atom or a metal atom, and Structural Formulae (α-1) and (α-2) illustrated below are assumed. In Structural Formulae (α-1) and (α-2) illustrated below, not a coordinate bond but only an ionic bond is taken into account. Although the oxide semiconductor layer 110 in this embodiment is formed with a metal oxide (an oxide semiconductor) containing In (indium), Ga (gallium), and Zn (zinc) described above, the metal atoms in Structural Formulae (α-1) and (α-2) illustrated below are Ga (gallium).

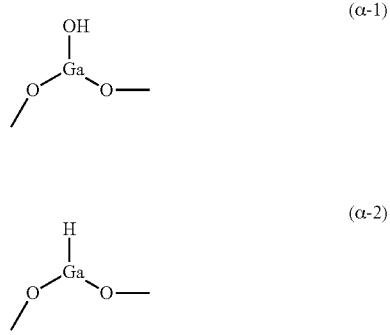

As processes in which hydrogen present in the oxide semiconductor layer 110 is eliminated by a fluorine atom, there are hydrogen abstraction reactions represented by (Formula 1) and (Formula 2).

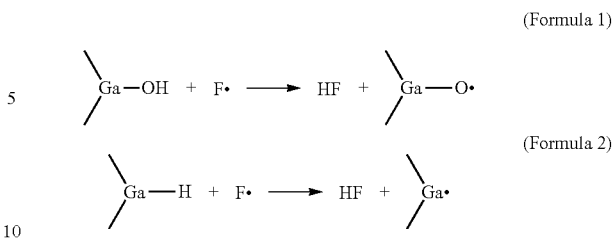

In (Formula 1), a fluorine radical reacts with a hydrogen atom of hydroxyl to form an HF (hydrogen fluoride) molecule. In (Formula 2), a fluorine radical reacts with a hydrogen atom bonded to a gallium atom to form an HF (hydrogen fluoride) molecule. Note that the symbol "·" in (Formula 1) and (Formula 2) denotes a radical.

Figure 2A:
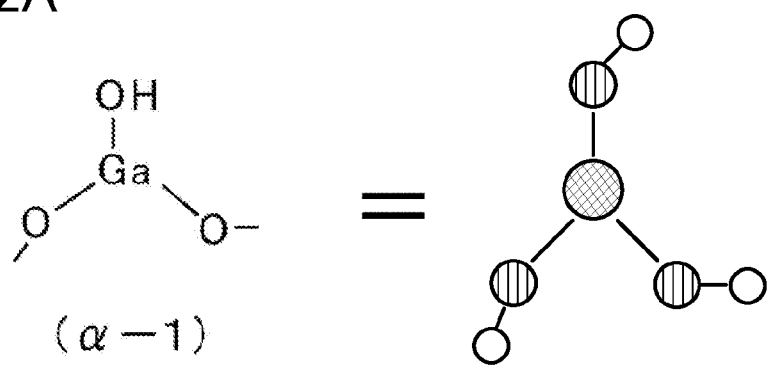
FIGS. 2A and 2B each illustrate cluster models in which a gallium atom is at the center.
Figure 2B:
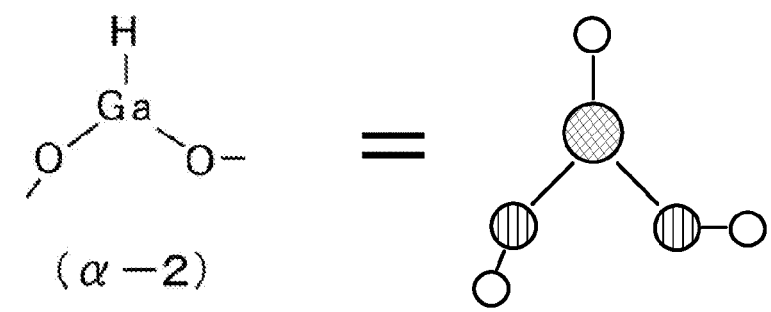

In the quantum chemistry calculation here, with simple cluster models illustrated in FIGS. 2A and 2B for the above Structural Formulae (α-1) and (α-2), activation energy in the above reactions are calculated to estimate the easiness of the reactions.

FIGS. 3A and 3B illustrate a reaction pathway obtained by analysis and an energy diagram, for which the quantum chemistry calculation made of the reaction in (Formula 1).

In FIGS. 3A and 3B, Initial State (1) is a state where a fluorine radical is infinitely far from the reactant surrounded by the dotted line. In the energy diagram illustrated in FIGS. 3A and 3B, the energy of Initial State (1) is a baseline. In Intermediate (2), approach of the fluorine radical to a gallium atom causes cleavage of a Ga—O bond, generation of a hydroxyl radical, and formation of a Ga—F bond. By such a reaction, the potential energy of Intermediate (2) becomes −1.67 eV. In Intermediate (3), a hydrogen atom of the hydroxyl radical is abstracted by the fluorine atom to generate an HF molecule. The activation energy, which is a difference between the potential energies of Intermediate (2) and Intermediate (3), is calculated as 0.61 eV. In Intermediate (4), an oxygen radical and the HF molecule interact with each other. Final State (5) is a state where the HF molecule is infinitely far from the reactant surrounded by the dashed line.

Figure 4A:
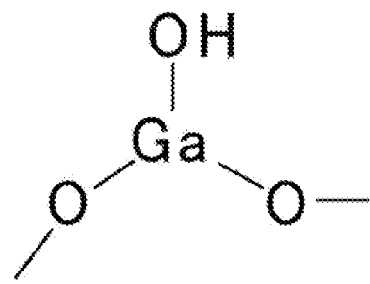
FIGS. 4A to 4D illustrate models used for calculation of bond energy.
Figure 4B:
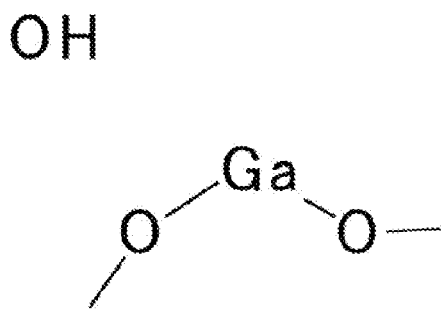
Figure 4C:
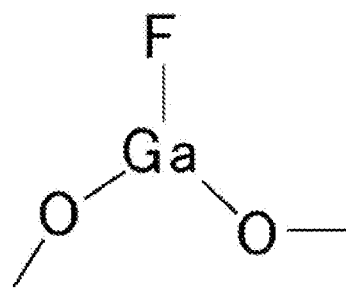
Figure 4D:
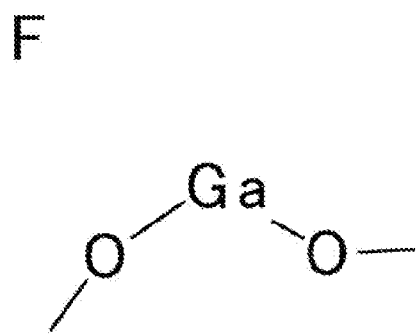

The cleavage of a Ga—O bond and the formation of a Ga—F bond in Intermediate (2), which are caused by the approach of the fluorine radical to the gallium atom, are due to the fact that the bond energy of the Ga—O bond is 4.37 eV and the bond energy of the Ga—F bond is 5.31 eV. The bond energy of the Ga—O bond here means a value obtained by calculation of a difference between the potential energies of the state where hydroxyl is bonded to a gallium atom (see FIG. 4A) and the state where a hydroxyl radical is at infinity (see FIG. 4B). The bond energy of the Ga—F bond here means a value obtained by calculation of a difference between the potential energies of the state where fluorine is bonded to a gallium atom (see FIG. 4C) and the state where a fluorine radical is at infinity (see FIG. 4D).

The difference between the energies of Initial State (1) and Final State (5) reveals that the reaction illustrated in (Formula 1), in which hydrogen present in the oxide semiconductor layer 110 is abstracted, is an exothermic reaction. Therefore, it can be said that the hydrogen abstraction reaction proceeds easily.

FIGS. 5A and 5B illustrate a reaction pathway obtained by analysis and an energy diagram, for which the quantum chemistry calculation made of the reaction in (Formula 2).

In FIGS. 5A and 5B, Initial State (1) is a state where a fluorine radical is infinitely far from the reactant surrounded by the dotted line. In the energy diagram illustrated in FIGS. 5A and 5B, the energy of Initial State (1) is a baseline. In Intermediate (2), approach of the fluorine radical to a gallium atom causes cleavage of a Ga—H bond, generation of a hydrogen radical, and formation of a Ga—F bond. By this reaction, the potential energy of Intermediate (2) becomes −1.99 eV. In Transition State (3), the hydrogen radical is bonded to a fluorine atom to generate an HF molecule. The activation energy, which is a difference between the potential energies of Intermediate (2) and Intermediate (3), is calculated as 0.45 eV. In Intermediate (4), an oxygen atom bonded to the gallium atom and the HF molecule interact with each other. Final State (5) is a state where the HF molecule is infinitely far from the reactant surrounded by the dashed line.

As in (Formula 1), the cleavage of a Ga—H bond and the formation of a Ga—F bond in Intermediate (2), which are caused by the approach of the fluorine radical to the gallium atom, are due to the fact that the Ga—F bond is more stable than the Ga—H bond in terms of bond energy for the reason described for (Formula 1).

The difference between the energies of Initial State (1) and Final State (5) reveals that the reaction illustrated in (Formula 2), in which hydrogen present in the oxide semiconductor layer 110 is abstracted, is also an exothermic reaction. Therefore, it can be said that the hydrogen abstraction reaction proceeds easily.

Thus, it is possible to eliminate hydrogen present in the oxide semiconductor layer 110 by the use of an insulating layer containing fluorine as the gate insulating layer 108 in contact with the oxide semiconductor layer 110 and the insulating layer 114.

[Fabrication Method of Transistor 100]

A method of fabricating the transistor 100 will specifically be described with reference to FIGS. 6A to 6D.

The base insulating layer 104 is formed over the substrate 102. The substrate 102 and the base insulating layer 104 can be as described above, and a glass substrate is used as the substrate 102 in this embodiment. Although capable of being formed by a plasma CVD method as well, the base insulating layer 104 is formed as follows in this fabrication method of a semiconductor device: a silicon oxide layer is formed to a thickness of 200 nm by an RF sputtering method using $SiO_2$ as a target and a rare gas such as argon and oxygen as gases that are supplied for the formation.

Next, a conductive film serving as the gate electrode layer 106 is formed. As the conductive film, in this fabrication method of a semiconductor device, a 150-nm-thick titanium film is formed by a DC sputtering method using a titanium target. Then, a first photolithography step and an etching step are performed, so that the gate electrode layer 106 having a thickness of 150 nm is formed.

Either wet etching or dry etching may be used for the etching of the conductive film. Note that dry etching is preferably used in terms of microfabrication of the element. An etching gas and an etchant can be selected as appropriate depending on a material that is to be etched.

A side surface of the gate electrode layer 106 preferably has a tapered shape so as to prevent disconnection at a step portion, since an oxide semiconductor film and a conductive film serving as the source electrode layer and the drain electrode layer are formed over the gate electrode layer 106 in later steps. The tapered shape of the side surface of the gate electrode layer 106 can be obtained in such a manner that etching is performed while a resist mask is recessed.

Next, the insulating layer 108 is formed. The insulating layer 108 is formed by a plasma CVD method, as described above. The inner wall of a reaction chamber in a plasma CVD apparatus is heated, so that impurities are released from the inner wall of the reaction chamber. After that, impurities remaining in the reaction chamber or the impurities released from the inner wall of the reaction chamber are removed by plasma cleaning using a fluorine compound such as nitrogen trifluoride ($NF_3$). In this embodiment, a capacitively-coupled plasma CVD apparatus using a high-frequency power source is used.

The temperature at which the inner wall of the reaction chamber in the plasma CVD apparatus is heated is greater than or equal to 100° C. and less than or equal to 350° C., preferably greater than or equal to 100° C. and less than or equal to 125° C., and at least for 30 minutes or more, preferably 60 minutes or more. Here, the heating step can be carried out while evacuation is performed.

There is no particular limitation on a method of the above plasma cleaning. In this fabrication method of a semiconductor device, the method of cleaning in which plasma is generated in the reaction chamber where the cleaning is performed is given as an example; however, remote plasma cleaning may be performed in which plasma is generated in advance outside the reaction chamber where the cleaning is performed, and the generated plasma is supplied to the reaction chamber for cleaning.

The plasma cleaning in this fabrication method of a semiconductor device includes a plasma treatment step and an evacuation step. Specific preferred conditions for the plasma cleaning are that nitrogen trifluoride ($NF_3$) is supplied to the reaction chamber at a flow rate of 400 sccm to 2000 sccm, the pressure in the reaction chamber is adjusted to 10 Pa to 200 Pa, the distance between electrodes is adjusted to 15 mm to 60 mm, a power of 500 W to 2000 W (1 $W/cm^2$ to 4 $W/cm^2$ as a power per unit electrode area (as a power density)) is output with a high-frequency power source at 13.56 MHz to 60 MHz so that plasma is generated, and the treatment time is 5 minutes to 10 minutes. More preferred conditions for the plasma cleaning are that nitrogen trifluoride ($NF_3$) is supplied to the reaction chamber at a flow rate of 600 sccm, the pressure in the reaction chamber is adjusted to about 70 Pa, the distance between electrodes is adjusted to 50 mm, and a power of 900 W (about 1.8 $W/cm^2$ in units of power densities) is output with a high-frequency power source at 60 MHz for 7 minutes.

Then, $SiF_4$ as the deposition gas, $N_2O$ as the gas for oxidation, and argon as the additional gas are supplied to the reaction chamber, so that a silicon oxide film is formed to a thickness of 200 nm using plasma energy. Furthermore, when the gate insulating layer 108 has two layers, it is possible that a silicon oxide film, for which $SiH_4$ is used as the deposition gas and which has a thickness of 150 nm, is formed as the first gate insulating layer in contact with the gate electrode layer 106, and that a silicon oxide film, for which a $SiF_4$ gas is used as the deposition gas and which has a thickness of 50 nm, is formed as the second gate insulating layer in contact with the oxide semiconductor layer 110.

Figure 6A:
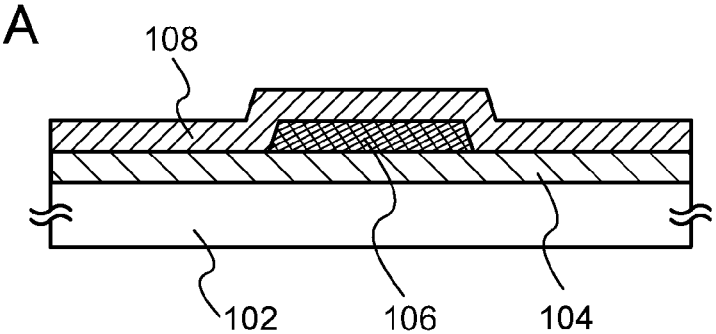
FIGS. 6A to 6D are cross-sectional views illustrating a method of manufacturing a transistor.

A structure obtained through the steps up to this point is illustrated in FIG. 6A.

Next, a 50-nm-thick oxide semiconductor film is formed by a sputtering method. Since the oxide semiconductor film is formed in contact with the gate insulating layer 108, fluorine contained in the gate insulating layer 108 eliminates hydrogen present in the oxide semiconductor film. Although a sputtering method is used in this embodiment, a vacuum evaporation method, a pulse laser deposition method, a CVD method, or the like may be used.

For the oxide semiconductor film, metal oxide described above can be used. In this fabrication method of a semiconductor device, an In—Ga—Zn—O-based non-single-crystal film having a thickness of 50 nm, which is obtained by a sputtering method using an oxide semiconductor target including indium (In), gallium (Ga), and zinc (Zn) ($In_2O_3$: $Ga_2O_3$:ZnO=1:1:1 or $In_2O_3$:$Ga_2O_3$:ZnO=1:1:2 in a molar ratio), is used. Furthermore, in this fabrication method of a semiconductor device, a DC sputtering method is employed, the flow rates of argon and oxygen are respectively 30 sccm and 15 sccm, and the temperature of the substrate is set to room temperature (15° C. to 35° C.).

Before the formation of the oxide semiconductor film by a sputtering method, reverse sputtering in which plasma is generated by introduction of an argon gas is preferably performed. The reverse sputtering refers to a method in which plasma is generated around the substrate to modify a surface by application of a voltage to a substrate side with use of an RF power source in an argon atmosphere. Instead of the argon atmosphere, a nitrogen atmosphere, a helium atmosphere, or the like may be used. Alternatively, the reverse sputtering may be performed in an atmosphere in which oxygen, nitrous oxide, or the like is added to argon, or an atmosphere in which chlorine, carbon tetrafluoride, or the like is added to argon.

In the formation of the oxide semiconductor film, for example, the substrate is held in a treatment chamber kept under reduced pressure, and heated so as to have a temperature greater than or equal to 100° C. and less than 550° C., preferably greater than or equal to 200° C. and less than or equal to 400° C. Alternatively, the substrate temperature in the formation of the oxide semiconductor film may be set to room temperature (15° C. to 35° C.). Then, while moisture in the treatment chamber is removed, a sputtering gas from which hydrogen, water, or the like is removed is introduced, and thus the oxide semiconductor film is formed using the oxide semiconductor target. By forming the oxide semiconductor film while the substrate is heated, impurities contained in the oxide semiconductor film can be reduced. In addition, damage due to sputtering can be reduced. In order to remove moisture in the treatment chamber, an entrapment vacuum pump is preferably used. For example, a cryopump, an ion pump, a titanium sublimation pump, or the like can be used. A turbo pump provided with a cold trap may be used. Evacuation using a cryopump or the like can remove hydrogen, water, or the like from the treatment chamber, and the concentration of impurities in the oxide semiconductor film can be reduced accordingly. After that, a second photolithography step and an etching step are performed, so that an oxide semiconductor layer 109 processed into an island shape is formed.

Figure 6B:
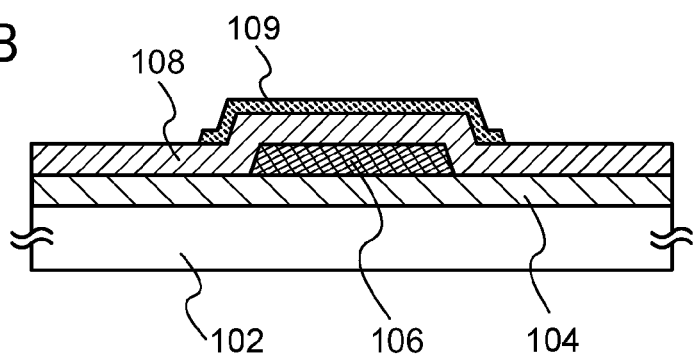

A structure obtained through the steps up to this point is illustrated in FIG. 6B.

Then, the oxide semiconductor layer 109 may be subjected to heat treatment in an atmospheric atmosphere, an inert gas atmosphere (nitrogen, helium, neon, argon, or the like), or air which has a dew point less than or equal to −60° C. under atmospheric pressure and a low moisture content. Specifically, in an atmospheric atmosphere, the heat treatment is performed at a temperature greater than or equal to 100° C. and less than or equal to 400° C. for 10 minutes or more, preferably at 350° C. for 60 minutes. By the heat treatment on the oxide semiconductor layer 109, the oxide semiconductor layer 110 from which moisture and hydrogen are eliminated is formed. Also at this time, fluorine contained in the gate insulating layer 108 eliminates hydrogen contained in the oxide semiconductor film. Further, oxygen is supplied from the gate insulating layer 108 to a defect of the oxide semiconductor layer 110.

In an inert gas atmosphere (such as nitrogen, helium, neon, argon, or the like), the heat treatment can be performed by RTA (rapid thermal annealing) treatment at a temperature greater than or equal to 500° C. and less than or equal to 750° C. (or a temperature less than or equal to the strain point of the glass substrate) for approximately greater than or equal to 1 minute and less than or equal to 10 minutes, preferably at 600° C. for approximately greater than or equal to 3 minutes and less than or equal to 6 minutes. Note that by using the RTA method, dehydration or dehydrogenation can be performed in a short time, and therefore the treatment can be performed even at a temperature exceeding the strain point of the glass substrate. In the heat treatment, it is preferable that moisture, hydrogen, and the like be not contained in nitrogen or a rare gas such as helium, neon, or argon of the inert gas. Alternatively, it is preferable that the nitrogen or rare gas such as helium, neon, or argon which is introduced into a heat treatment apparatus have a purity of 6N (99.9999%) or more, preferably 7N (99.99999%) or more (i.e. an impurity concentration of 1 ppm or less, preferably 0.1 ppm or less).

Note that the above heat treatment is not limited to being performed after the formation of the island-shaped oxide semiconductor layer 109, and the heat treatment may be performed on the oxide semiconductor film before the formation of the island-shaped oxide semiconductor layer 109. Furthermore, the heat treatment may be performed more than once.

As another method of the above heat treatment, heat treatment is performed for 60 minutes in an atmospheric atmosphere while the substrate temperature reaches the set temperature, 350° C. The heat treatment can employ a heating method using an electric furnace, a rapid heating method such as a GRTA (gas rapid thermal annealing) method using a heated gas or a LRTA (lamp rapid thermal annealing) method using lamp light, or the like. For example, in the case where an electric furnace is used for the heat treatment, temperature rise characteristics are preferably set to greater than or equal to 0.1° C./min and less than or equal to 20° C./min and temperature drop characteristics are preferably set to greater than or equal to 0.1° C./min and less than or equal to 15° C./min.

After the heat treatment in the inert gas atmosphere, the oxide semiconductor layer 110 is preferably amorphous, but may be partly crystallized.

Here, an exposed surface of the oxide semiconductor layer 110 may be subjected to plasma treatment using oxygen, ozone, or dinitrogen monoxide. The plasma treatment enables supply of oxygen to the defect of the oxide semiconductor layer 110.

Figure 6C:
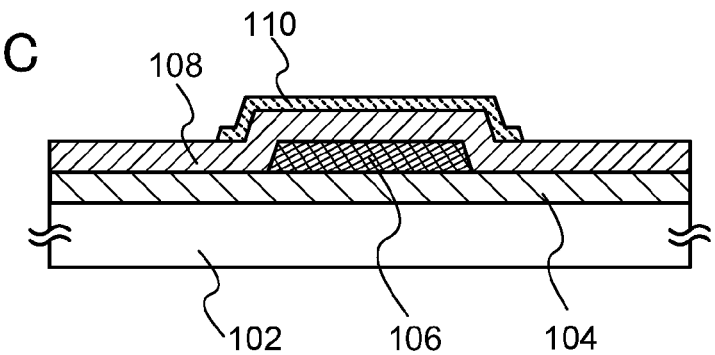

A structure obtained through the steps up to this point is illustrated in FIG. 6C.

Next, a conductive film that functions as a source electrode and a drain electrode is formed, and a third photolithography step and an etching step are performed, so that the source electrode layer 112a and the drain electrode layer 112b are formed. The conductive film can be the same as that of the gate electrode layer 106. In this fabrication method of a semiconductor device, a 150-nm-thick titanium film is formed by a sputtering method using a titanium target, and the third photolithography step and the etching step are performed, so that the source electrode layer 112a and the drain electrode layer 112b are formed.

After that, over the source electrode layer 112a and the drain electrode layer 112b, the insulating layer 114 is formed like the gate insulating layer 108. In this embodiment, a 50-nm-thick silicon oxide layer is formed as the insulating layer 114.

Figure 6D:
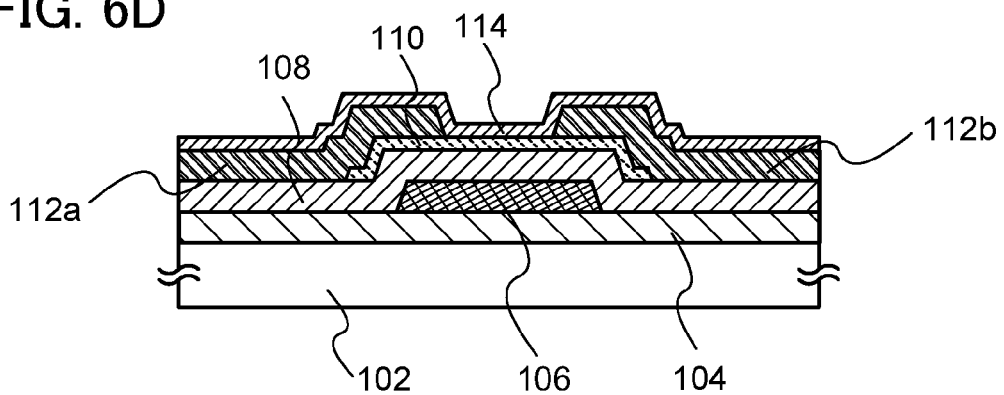

After the formation of the insulating layer 114, heat treatment may be performed. The heat treatment is performed in an atmospheric atmosphere or an inert gas atmosphere (nitrogen, helium, neon, argon, or the like) and preferably at a temperature greater than or equal to 200° C. and less than or equal to 400° C. In this embodiment, the heat treatment is preferably performed at 350° C. for 1 hour in an atmospheric atmosphere. A structure obtained through the steps up to this point is illustrated in FIG. 6D.

As described above, in the semiconductor device described in this embodiment, the use of the gate insulating layer having a reduced hydrogen concentration and containing fluorine enables suppression of hydrogen diffusion from the gate insulating layer into the oxide semiconductor layer and elimination of the hydrogen present in the oxide semiconductor layer; thus, the hydrogen content in the oxide semiconductor layer can be reduced. Consequently, the semiconductor device described in this embodiment is a semiconductor device having good electrical characteristics.

Note that a structure described in this embodiment can be combined as appropriate with any structure described in the other embodiments in this specification.

Embodiment 2

The transistor described in the above embodiment is fabricated and the transistor is used for a pixel portion and further for a driver circuit, so that a semiconductor device having a display function (also referred to as a display device) can be fabricated. Further, part or the whole of the driver circuit using the transistor is formed over a substrate where the pixel portion is provided, so that a system-on-panel can be obtained. Furthermore, with a transistor for which the oxide semiconductor material described in the above embodiment is used, a semiconductor device including a memory cell can also be fabricated.

The display device includes a display element. As the display element, a liquid crystal element (also referred to as a liquid crystal display element) or a light-emitting element (also referred to as a light-emitting display element) can be used. The category of the light-emitting element includes an element whose luminance is controlled by a current or a voltage, and specifically an inorganic EL (electroluminescence) element, an organic EL element, and the like. Furthermore, a display medium whose contrast is changed by electric action, such as electronic ink, can be used.

In addition, the display device includes a panel in which the display element is sealed, and a module in which an IC or the like including a controller is mounted on the panel. Furthermore, an element substrate, which corresponds to one embodiment obtained before the display element is completed in a fabrication process of the display device, is provided with a means for supplying current to the display element in each of pixels. Specifically, the element substrate may be in a state where only a pixel electrode of the display element is formed, a state after formation of a conductive film to be a pixel electrode and before etching of the conductive film to form the pixel electrode, or any other state.

Note that the display device in this specification refers to an image display device, a display device, or a light source (including a lighting device). Further, the display device is intended to include the following modules: a module to which a connector such as a FPC (flexible printed circuit), a TAB (tape automated bonding) tape, or a TCP (tape carrier package) is attached; a module having a TAB tape or a TCP which is provided with a printed wiring board at the end thereof; and a module having an IC (integrated circuit) which is directly mounted on the display element by a COG (chip on glass) method.

Embodiment 3

A display device using the transistor fabricated by the method of fabricating a transistor described in the above embodiment can be used for electronic paper in which electronic ink is driven to perform display. The electronic paper can be used for electronic devices of a variety of fields as long as they can display data. For example, electronic paper can be applied to electronic books (e-books), a poster, digital signages, PIDs (public information displays), advertisements in vehicles such as trains, displays of various cards such as credit cards, and the like. An example of the electronic device is illustrated in FIG. 7.

Figure 7:
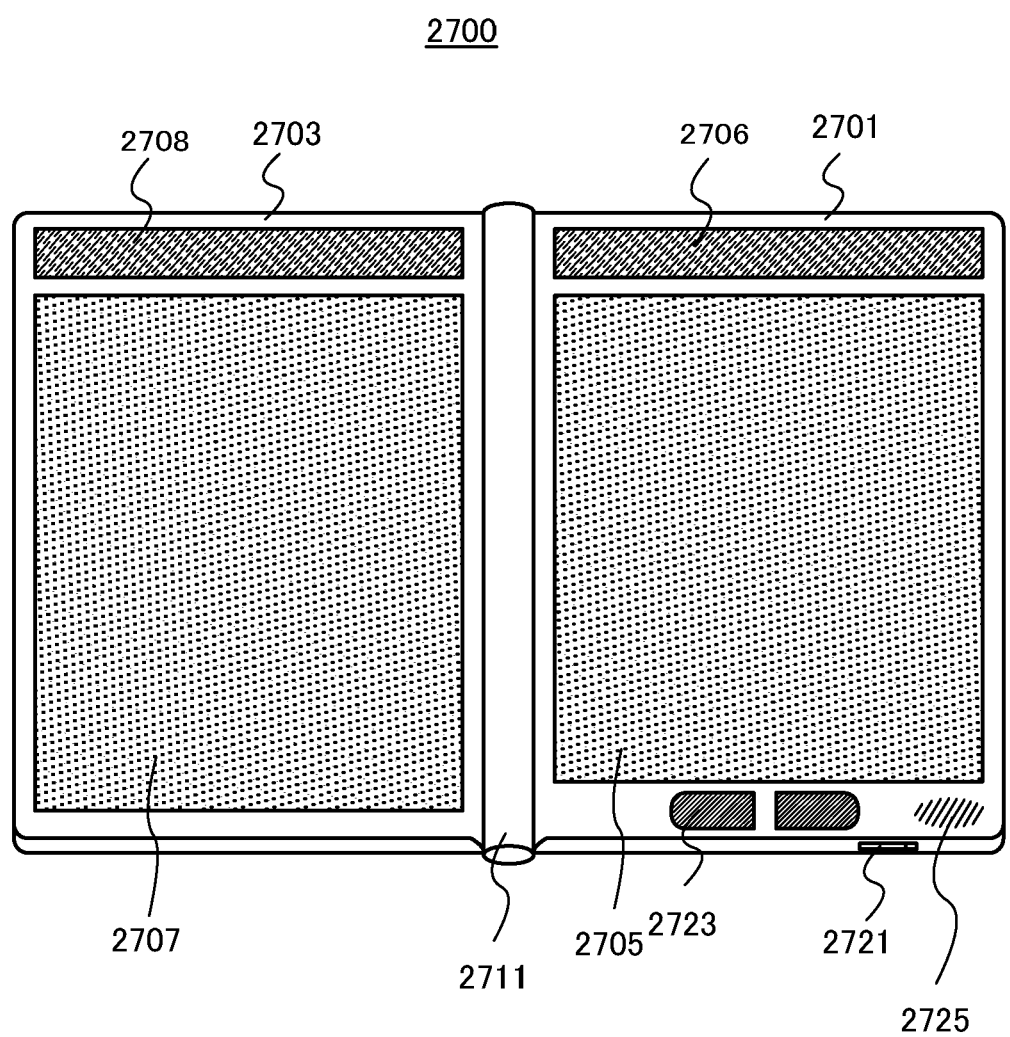
FIG. 7 is an external view illustrating an example of an electronic book.

FIG. 7 illustrates an example of an electronic book. For example, an electronic book 2700 includes two housings, a housing 2701 and a housing 2703. The housing 2701 and the housing 2703 are combined with a hinge 2711 so that the electronic book 2700 can be opened and closed with the hinge 2711 as an axis. With such a structure, the electronic book 2700 can operate like a paper book.

A display portion 2705 and a photoelectric conversion device 2706 are incorporated in the housing 2701. A display portion 2707 and a photoelectric conversion device 2708 are incorporated in the housing 2703. The display portion 2705 and the display portion 2707 may display one image or different images. In the case where the display portion 2705 and the display portion 2707 display different images, for example, text can be displayed on a display portion on the right side (the display portion 2705 in FIG. 7) and graphics can be displayed on a display portion on the left side (the display portion 2707 in FIG. 7).

FIG. 7 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may also be provided on the surface of the housing, on which the display portion is provided. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the electronic book 2700 may have a function of an electronic dictionary.

The electronic book 2700 may have a configuration capable of wirelessly transmitting and receiving data. Through wireless communication, desired book data or the like can be purchased and downloaded from an electronic book server.

Embodiment 4

A semiconductor device disclosed in this specification can be applied to a variety of electronic devices (including game machines). Examples of electronic devices are television devices (also referred to as televisions or television receivers), monitors of computers or the like, cameras such as digital cameras or digital video cameras, digital photo frames, mobile phones (also referred to as mobile telephones or mobile phone devices), portable game consoles, portable information terminals, audio reproducing devices, large-sized game machines such as pachinko machines, and the like.

Figure 8A:
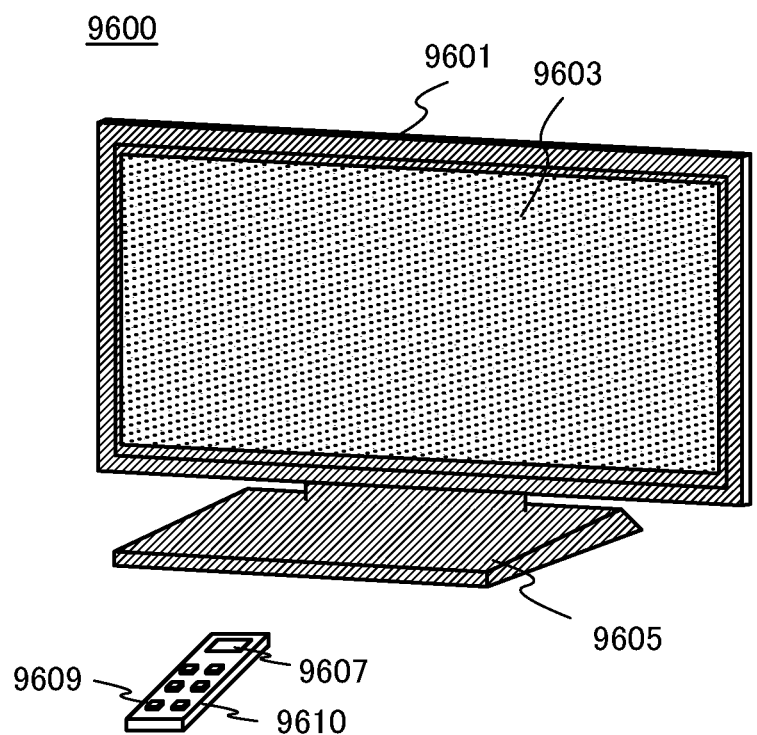
FIGS. 8A and 8B are external views illustrating examples of a television device and a digital photo frame.

FIG. 8A illustrates an example of a television set. In a television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 8B:
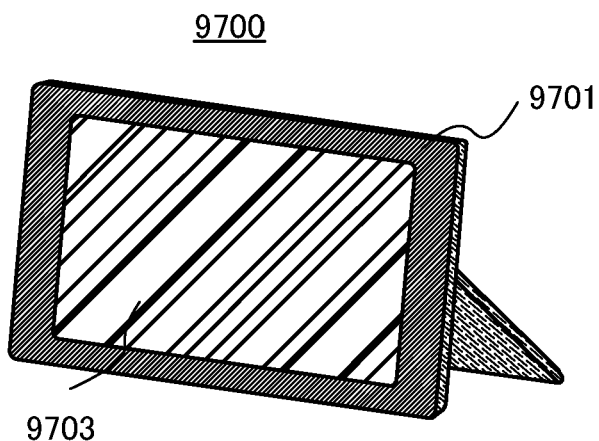

FIG. 8B illustrates an example of a digital photo frame. For example, in a digital photo frame 9700, a display portion 9703 is incorporated in a housing 9701. The display portion 9703 can display a variety of images. For example, the display portion 9703 can display data of an image taken with a digital camera or the like and function as a normal photo frame Note that the digital photo frame 9700 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

Figure 9:
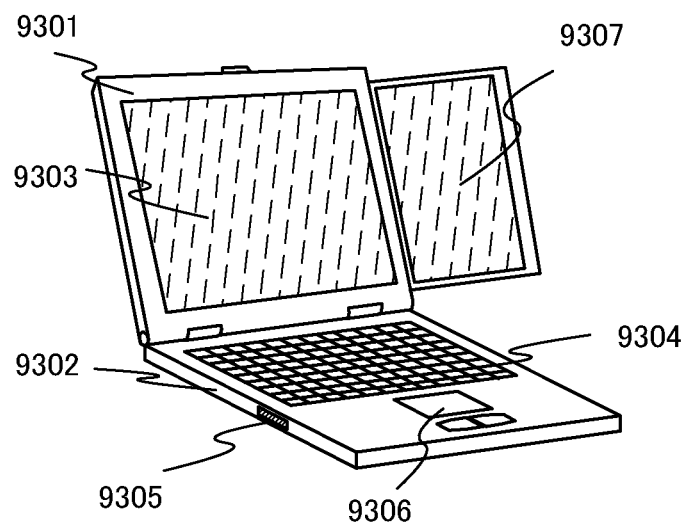
FIG. 9 is a perspective view illustrating an example of a portable computer.

FIG. 9 is a perspective view illustrating an example of a portable computer.

In the portable computer of FIG. 9, a top housing 9301 having a display portion 9303 and a bottom housing 9302 having a keyboard 9304 can overlap with each other by closing a hinge unit which connects the top housing 9301 and the bottom housing 9302. Thus, the portable computer illustrated in FIG. 9 is conveniently carried. Moreover, in the case of using the keyboard for input of data, the hinge unit is opened so that a user can input data looking at the display portion 9303.

The bottom housing 9302 includes a pointing device 9306 with which input can be performed, in addition to the keyboard 9304. Further, when the display portion 9303 is a touch input panel, input can be performed by touching part of the display portion. The bottom housing 9302 includes an arithmetic function portion such as a CPU or hard disk. In addition, the bottom housing 9302 includes an external connection port 9305 into which another device such as a communication cable conformable to communication standards of a USB is inserted.

The top housing 9301 further includes a display portion 9307 which can be stored in the top housing 9301 by being slid therein. Thus, a large display screen can be realized. In addition, the user can adjust the orientation of a screen of the storable display portion 9307. When the storable display portion 9307 is a touch input panel, input can be performed by touching part of the storable display portion 9307.

The display portion 9303 or the storable display portion 9307 is formed with an image display device of a liquid crystal display panel, a light-emitting display panel such as an organic light-emitting element or an inorganic light-emitting element, or the like.

In addition, the portable computer in FIG. 9, which can be provided with a receiver and the like, can receive a television broadcast to display an image on the display portion 9303 or the display portion 9307. The user can watch television broadcast when the whole screen of the display portion 9307 is exposed by sliding the display portion 9307 while the hinge unit which connects the top housing 9301 and the bottom housing 9302 is kept closed. In this case, the hinge unit is not opened and display is not performed on the display portion 9303. In addition, start up of only a circuit for displaying television broadcast is performed. Therefore, power can be consumed to the minimum, which is useful for the portable computer whose battery capacity is limited.

Example 1

In this example, a silicon oxide film (Sample A) applicable to a semiconductor device (specifically, a gate insulating layer of a transistor, or the like) described in Embodiment 1 was formed, and the concentrations of hydrogen and fluorine in Sample A were estimated.

First, a method of forming Sample A will be described. Sample A was formed by a plasma CVD method.

The inner wall of the reaction chamber in the plasma CVD apparatus was heated for 60 minutes so as to have a temperature of 115° C., so that a gas containing impurities remaining in or attached to the reaction chamber was released.

Next, while the inner wall of the reaction chamber was heated at 115° C., plasma cleaning was carried out under the conditions that nitrogen trifluoride ($NF_3$) was supplied to the reaction chamber at a flow rate of 600 sccm, the pressure in the reaction chamber was adjusted to about 70 Pa, the gap was adjusted to 50 mm, and a power of 900 W was output with a high-frequency power source at 60 MHz for 7 minutes, so that a gas including impurities was removed. Note that the area of an electrode in the plasma CVD apparatus used in this example is 490 cm$^2$.

After the plasma cleaning, a silicon oxide film was formed to a target thickness of 200 nm over a silicon wafer while the inner wall of the reaction chamber was heated at 115° C. At this time, silane fluoride ($SiF_4$) as a deposition gas containing silicon at a flow rate of 6 sccm, oxygen dinitride ($N_2O$) as an additional gas at a flow rate of 1000 sccm, and Ar as an inert gas at a flow rate of 1000 sccm were supplied to the reaction chamber, the pressure in the reaction chamber was adjusted to 133 Pa, the gap was adjusted to 10 mm, the temperature of the silicon wafer over which the silicon oxide film was to be formed was adjusted to 400° C., and a power of 800 W was output with a high-frequency power source at 60 MHz, so that the silicon oxide film was formed.

Figure 10:
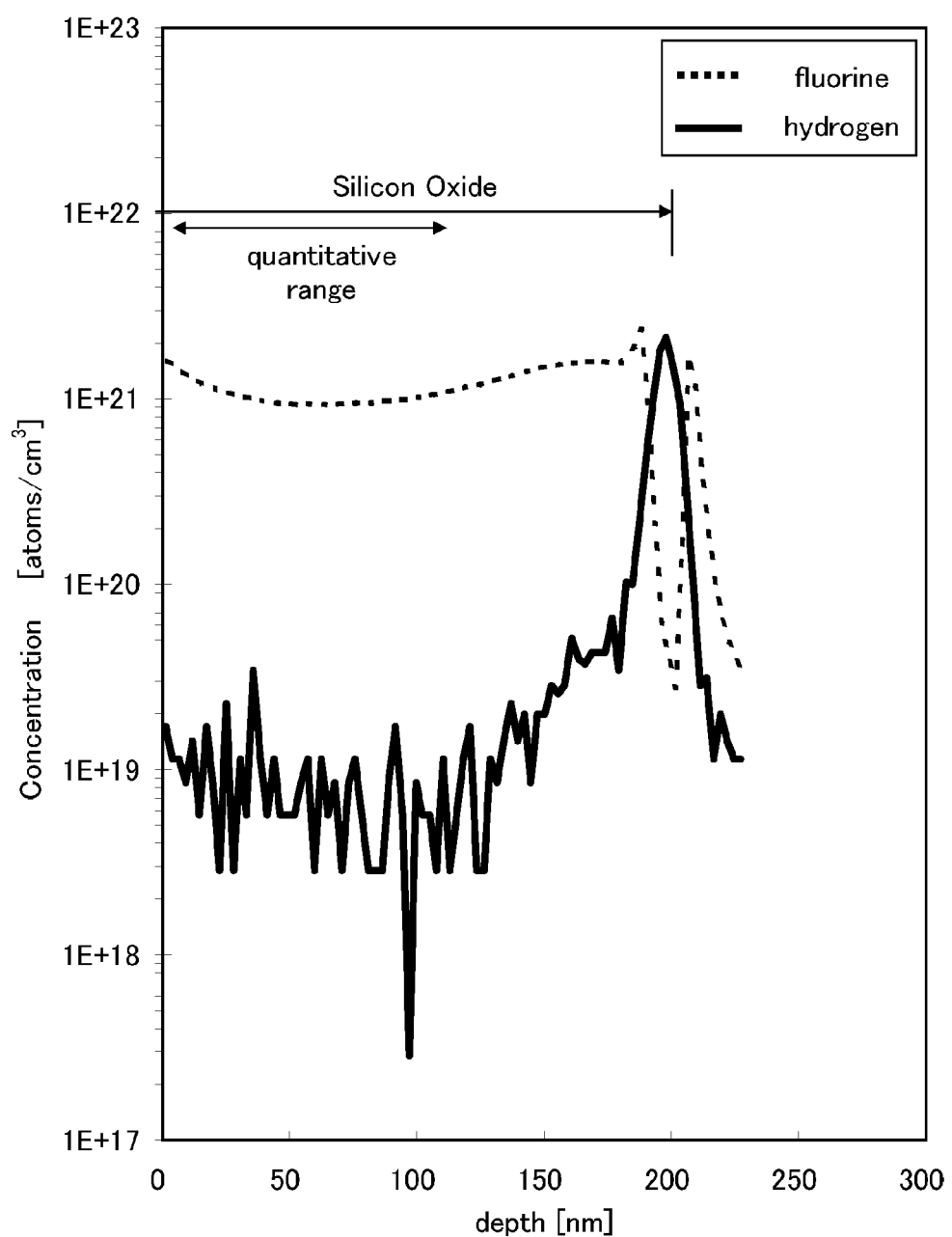
FIG. 10 shows the concentrations of hydrogen and fluorine contained in a silicon oxide layer.

Next, SIMS measurement was carried out for Sample A, and the results thereof are shown in FIG. 10. In FIG. 10, the vertical axis represents the concentration of hydrogen or fluorine in Sample A, and the horizontal axis represents the depth from a surface of the silicon oxide film of Sample A in the substrate direction. Further, the solid line represents a profile of the hydrogen concentration in Sample A, and the broken line represents a profile of the fluorine concentration in Sample A. For Sample A, the range of 10 nm to 120 nm along the horizontal axis represents a quantitative range and the range of 200 nm or more along the horizontal axis represents the silicon wafer.

It was found from FIG. 10 that the hydrogen concentration in Sample A was $3.4 \times 10^{19}$ atoms/cm$^3$ or less and the fluorine concentration in Sample A was $9.2 \times 10^{20}$ atoms/cm$^3$ or more in the quantitative range.

As described above, by using silane fluoride (SiF$_4$), a silicon oxide layer can be formed having a reduced hydrogen concentration and a fluorine concentration that enables elimination of hydrogen from an oxide semiconductor layer. By applying the silicon oxide film described in this example to a semiconductor device (specifically, a gate insulating layer of a transistor, or the like), a semiconductor device (a transistor) having good electrical characteristics can be fabricated.

This application is based on Japanese Patent Application serial no. 2010-139207 filed with the Japan Patent Office on Jun. 18, 2010, the entire contents of which are hereby incorporated by reference.

What is claimed is:

1. A semiconductor device comprising:
   a gate electrode layer;
   a gate insulating layer over the gate electrode layer;
   an oxide semiconductor layer over the gate insulating layer;
   a source electrode layer and a drain electrode layer over and in contact with the oxide semiconductor layer; and
   an insulating layer over and in contact with the oxide semiconductor layer, the source electrode layer, and the drain electrode layer,
   wherein a hydrogen concentration in the gate insulating layer is less than $6 \times 10^{20}$ atoms/cm$^3$ and a fluorine concentration in the gate insulating layer is greater than or equal to $1 \times 10^{20}$ atoms/cm$^3$.

2. The semiconductor device according to claim 1, wherein the gate insulating layer comprises silicon oxide, silicon oxynitride, silicon nitride oxide, hafnium oxide, aluminum oxide, or tantalum oxide.

3. The semiconductor device according to claim 1, wherein the oxide semiconductor layer includes a crystallized region.

4. The semiconductor device according to claim 1, wherein the oxide semiconductor layer includes a region containing silicon.

5. The semiconductor device according to claim 1, wherein the oxide semiconductor layer includes a crystallized region, and a region containing silicon.

6. A semiconductor device comprising:
   a gate electrode layer;
   a gate insulating layer over the gate insulating layer;
   an oxide semiconductor layer over the gate insulating layer;
   a source electrode layer and a drain electrode layer over and in contact with the oxide semiconductor layer; and
   an insulating layer over and in contact with the oxide semiconductor layer, the source electrode layer, and the drain electrode layer,
   wherein a hydrogen concentration in the gate insulating layer is less than $6 \times 10^{20}$ atoms/cm$^3$ and a fluorine concentration in the gate insulating layer is greater than or equal to $1 \times 10^{20}$ atoms/cm$^3$, and
   wherein a hydrogen concentration in the insulating layer is less than $6 \times 10^{20}$ atoms/cm$^3$ and a fluorine concentration in the insulating layer is greater than or equal to $1 \times 10^{20}$ atoms/cm$^3$.

7. The semiconductor device according to claim 6, wherein the gate insulating layer comprises silicon oxide, silicon oxynitride, silicon nitride oxide, hafnium oxide, aluminum oxide, or tantalum oxide.

8. The semiconductor device according to claim 6, wherein the oxide semiconductor layer includes a crystallized region.

9. The semiconductor device according to claim 6, wherein the oxide semiconductor layer includes a region containing silicon.

10. The semiconductor device according to claim 6, wherein the oxide semiconductor layer includes a crystallized region, and a region containing silicon.

11. A semiconductor device comprising:
    a gate electrode layer;
    a first gate insulating layer over the gate electrode layer;
    a second gate insulating layer over the first gate insulating layer;
    an oxide semiconductor layer over and in contact with the second gate insulating layer;
    a source electrode layer and a drain electrode layer over and in contact with the oxide semiconductor layer; and
    an insulating layer over and in contact with the oxide semiconductor layer, the source electrode layer, and the drain electrode layer,
    wherein a hydrogen concentration in the second gate insulating layer is less than $6 \times 10^{20}$ atoms/cm$^3$ and a fluorine concentration in the second gate insulating layer is greater than or equal to $1 \times 10^{20}$ atoms/cm$^3$.

12. The semiconductor device according to claim 11, wherein the second gate insulating layer comprises silicon oxide, silicon oxynitride, silicon nitride oxide, hafnium oxide, aluminum oxide, or tantalum oxide.

13. The semiconductor device according to claim 11, wherein a fluorine concentration in the first gate insulating layer is less than $1 \times 10^{20}$ atoms/cm$^3$.

14. The semiconductor device according to claim 11, wherein the oxide semiconductor layer includes a crystallized region.

15. The semiconductor device according to claim 11, wherein the oxide semiconductor layer includes a region containing silicon.

16. The semiconductor device according to claim 11, wherein the oxide semiconductor layer includes a crystallized region, and a region containing silicon.

* * * * *

UNITED STATES PATENT AND TRADEMARK OFFICE
CERTIFICATE OF CORRECTION

| | | |
|---|---|---|
| PATENT NO. | : 8,552,425 B2 | Page 1 of 1 |
| APPLICATION NO. | : 13/157637 | |
| DATED | : October 8, 2013 | |
| INVENTOR(S) | : Ichijo et al. | |

It is certified that error appears in the above-identified patent and that said Letters Patent is hereby corrected as shown below:

In the Claims

Claim 6, column 19, line 53, "a gate insulating layer over the gate insulating layer" should be --a gate insulating layer over the gate electrode layer--.

Signed and Sealed this
Second Day of September, 2014

Michelle K. Lee
*Deputy Director of the United States Patent and Trademark Office*